(12) United States Patent
Matsuhira

(10) Patent No.: US 7,283,373 B2
(45) Date of Patent: Oct. 16, 2007

(54) ELECTRONIC DEVICE

(75) Inventor: Tsutomu Matsuhira, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 10/368,240

(22) Filed: Feb. 18, 2003

(65) Prior Publication Data

US 2003/0174480 A1  Sep. 18, 2003

(30) Foreign Application Priority Data

Feb. 19, 2002  (JP) .............................. 2002-041402

(51) Int. Cl.
*H05K 1/18* (2006.01)
(52) U.S. Cl. .................. 361/764; 361/777; 257/778; 257/777; 174/260; 174/261; 174/257
(58) Field of Classification Search ................ 361/764, 361/760, 720, 736, 777, 698, 778; 257/777–778, 257/698, 758; 174/260–261, 257
See application file for complete search history.

(56) References Cited

U.S. PATENT DOCUMENTS 6,052,172 A * 4/2000 Kajiwara et al. ........... 349/152
6,222,935 B1 * 4/2001 Okamoto .................... 382/149
6,278,128 B1 * 8/2001 Noji et al. .................... 257/48
6,288,346 B1 * 9/2001 Ojiri et al. .................. 174/260
6,627,984 B2 * 9/2003 Bruce et al. ................ 257/686
6,828,817 B2 * 12/2004 Fujita ......................... 324/770

FOREIGN PATENT DOCUMENTS

JP  10115657  5/1998
JP  01135679  5/2001

* cited by examiner

*Primary Examiner*—Dean A. Reichard
*Assistant Examiner*—Hung S. Bui
(74) *Attorney, Agent, or Firm*—Adams & Wilks

(57) ABSTRACT

An electronic device comprises an IC provided with an array of pads a preselected number of which define inspection pads of the IC. A substrate has inspection patterns and is mounted on the IC so that each inspection pad is brought into contact with a corresponding inspection pattern to thereby enable electrical inspection of a mounting condition of the IC on the substrate. A pair of inspection lands is provided on the substrate and connected to some of the inspection patterns. The inspection pads and the inspection patterns are connected by wiring provided on the IC or on the substrate so that the inspection lands are electrically connected to each other when the IC is mounted on the substrate. A centerline of at least one of the inspection patterns is offset in position from a centerline of the corresponding inspection pad in width directions of the inspection pattern and the inspection pad.

15 Claims, 5 Drawing Sheets

ELECTRONIC DEVICE

BACKGROUND OF THE INVENTION

1. Field of the Invention

The present invention relates to an electronic in which a semiconductor element is utilized. More particularly, the present invention relates to a circuit on which a driver IC for driving a display panel used in a portable device, an electronic databook, a memory, a controller, or the like, is bare-chip mounted, and to an electronic device having this circuit.

2. Description of the Related Art

Conventionally, in the case of mounting a semiconductor chip by using a bump formed on a part of an IC chip, the semiconductor chip is welded by pressure on a substrate by means of an anisotropic conductive film, or a silver paste is printed on the bump to be connected to the substrate with underfill filled therebetween, so that the semiconductor chip is connected on the substrate. As a bump, a stud bump and a plating bump formed by plating the Au bump are used.

In addition, by using a metal diffusion contact, the semiconductor chip could be mounted on the substrate. In this case, according to one known method, by using solder as a bump on the IC, the semiconductor chip is soldered on an electrode of a substrate and the underfill is filled therebetween. In addition, according to another known method, by using Au as a bump on the IC, Sn plating is provided on the electrode of the substrate, Au—Sn diffusion connection is performed between the Au bump of the IC and the Sn plating electrode of the substrate, and then, the underfill is filled therebetween.

For evaluating the connection condition of a semiconductor IC that has been mounted as described above, a method is utilized in which a signal is input to confirm an output waveform, and another method is utilized in which the connection condition is judged by its visual appearance. As mounting defects, a connection defect is detected when the inclination of a bonding head is deviated and a mounting positional deviation may also be considered a defect.

In face down mounting of the semiconductor IC, since a circuit surface of the IC and a terminal surface of the substrate are bonded, the connection part is invisible, so that a defect cannot be confirmed. Therefore, in order to confirm the connection condition, the bonded part is broken down to observe the connection part. However, this method has a problem such that a product is not capable of being inspected one by one.

In addition, according to the method for confirming the output waveform by inputting a signal to the IC, an inspection device becomes expensive and it takes a long time to inspect all products. Furthermore, the connection appearance is unobservable, so that it is not possible to inspect the positional deviation.

Therefore, in order to inspect the conenction and the positional deviation, an inspection bump and an inspection pattern are disposed at each corner of the semiconductor IC and a flexible substrate on which the IC is mounted, respectively, and the connection is confirmed as being in an open- or short-circuit condition. If connection at each corner is established, correlation data may be utilized to determine that there is no problem in the connection. In this case, by making a probe contact a land for inspection, which is derived from each corner, the inspection is performed. As shown in FIG. 11, at each corner of the IC1 which is mounted on a flexible substrate connected to the display panel 6, an inspection land 4 is provided. However, it is the often the case that it is difficult to arrange an inspection land 4 at each corner in the product design. In the case that the inspection land is installed at each corner, as seen by the display unit shown in FIG. 11, the outer shape of the product becomes large due to the installation of the inspection lands. In order to reduce the size of the outer shape of the product, from two opposing corners of the IC or from two positions on a longer side of the IC, the inspection land is derived to perform the inspection. However, a mounting defect in the corner at an uninspected portion is not capable of being inspected, so that a defective flow can be observed. In the case of automatic mounting, the mounting of the IC involves a problem of loose amount of defective products during the positional deviation and the parallelism deviation.

SUMMARY OF THE INVENTION

The present invention has been made in view of the foregoing problems, and an object of the present invention is to increase the mounting density of a flexible substrate by reducing the number of lands for inspection at respective corners of an IC and further, by making the flexible substrate smaller, to improve a degree of accuracy of the inspection in the connection inspection.

In order to attain the above described object, an IC for controlling the driving of a functional element is face-down mounted on a substrate, on which a pattern is printed, and further, in an electronic device, in which this substrate is electrically connected to the functional element, in order to electrically inspect the mounting position of the IC bumps and the pattern on the substrate at a plurality of positions, an inspection circuit is configured by an electrode and a wire, which are formed on the IC and the substrate, respectively. The inspection circuit is formed on the IC and the flexible substrate of each position where the inspection is performed, and depending on the connection condition, the inspection circuit is electrically open or short. In addition, in order to inspect a plurality of the inspection circuits together, the plural inspection circuits are connected to each other through the wire of the IC or the wire of the flexible substrate so as to inspect the plural inspection circuits at the same time, so that, independent of the number of the inspection parts, the number of the inspection lands could be reduced to two.

In addition, a dummy bump is installed on the IC. By connecting at least one of the inspection circuits to this dummy bump, and connecting the dummy bump and the inspection land of the flexible substrate, a pattern provided with the inspection land may be derived at an arbitrary position in the above-described configuration of the inspection circuit. In the display unit that is produced based on such a configuration, it is easy to dispose the land for inspecting the IC mounting, and in accordance with this, the density of the mounted parts can be higher. In addition, this leads to downsizing of the flexible substrate. Further, since the inspection of the positional deviation is capable of being performed reliably, the feedback of mounting in a step becomes easier, and the defect may be reduced, which is generated by the delay of the feedback. In addition, a quality of the product has been improved.

DETAILED DESCRIPTION OF THE INVENTION

In an electronic device according to the present invention, an IC, in which an inspection bump used for mounting inspection, or a bump that does not interfere with other signal electrode is provided, is used.

The electronic device according to the present invention may include a substrate, on which an IC is mounted, a plurality of inspection circuits for electrically inspecting a mounting condition, each of which is located at a different position on the IC and the substrate, a plurality of inspection lands, each of which is connected to the inspection circuits of the flexible substrate, and a functional element, which is connected to the substrate, wherein the inspection circuit is provided with a plurality of inspection pads formed on the IC and a plurality of inspection patterns formed on the substrate so as to correspond to the inspection pads and the inspection pads and the inspection patterns are formed so that the inspection lands are electrically connected with each other only by mounting the IC on the substrate.

In addition, the electronic device according to the present invention may include an IC, on which a plurality of inspection pads are formed, a substrate on which a plurality of inspection patterns are formed so as to correspond to the inspection pads, and on which is formed a pair of inspection lands connected to some of the inspection patterns, and a functional element connected to the substrate and being activated by the IC, wherein the inspection pad and the inspection pattern are arranged and wired so that the inspection lands are electrically connected with each other only by mounting the IC on the substrate.

In addition, the inspection pad and the inspection pattern are formed at a corner of the IC. Alternatively, the inspection pad is disposed at the midstream of the pad array of the IC and the inspection land is connected to the inspection pattern corresponding to the inspection pad at the midstream.

Figure 12:
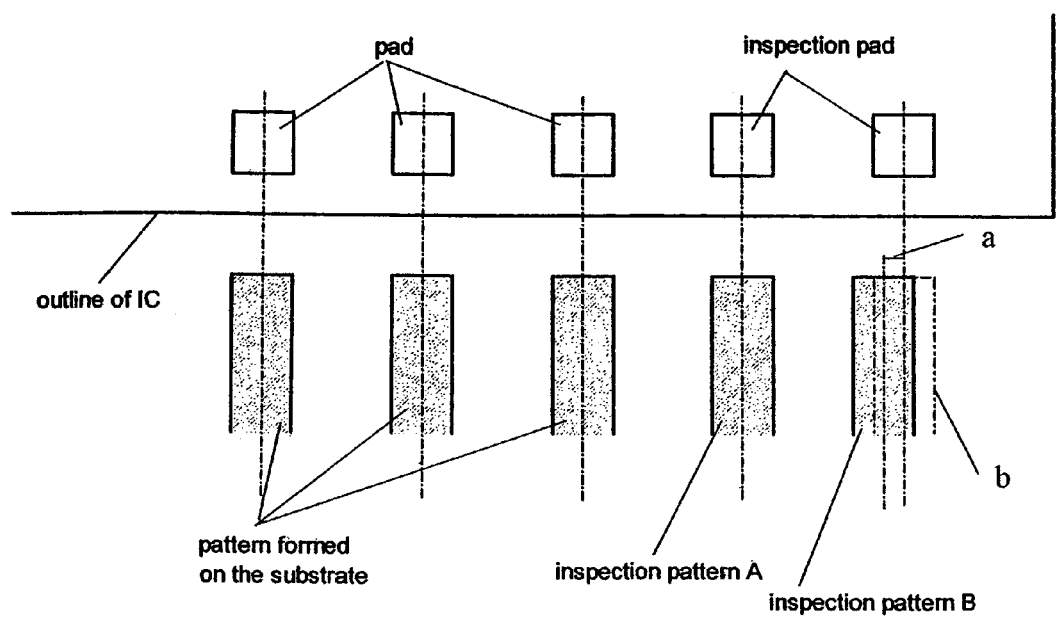
FIG. 12 is a schematic view showing the deviation or offset feature between an inspection pad and an inspection pattern.

In addition, the inspection pattern is offset or deviated from the right position of the inspection pad, the inspection pad and the inspection pattern are arranged and wired to be between the inspection lands that are electrically open when the IC is mounted on the substrate with deviation. Accordingly, when the deviation amount is set to the maximum limit of a positional deviation allowable range, it is possible to judge whether or not position adjustment has been achieved. In addition, the pattern for inspection may be arranged with deviation by a margin amount of the positional deviation. For example, as shown in FIG. 12, an inspection pattern B is offset from one of the inspection pads by an offset amount a. The non-offset position of the inspection pattern B is shown by a phantom line b. In case that a misalignment occurs between the IC and the substrate, the inspection circuit formed by the inspection patterns A, B and the inspection pads will be electrically open.

On the contrary to the above-described configuration, in the case that the IC is mounted on the substrate with deviation, the inspection pad and the inspection pattern may be arranged and wired so that the inspection lands are conducted with each other. In other words, the electronic device according to the present invention may be designed so that it is defined as good in an open-circuit state and is defined as being no-good in a conductive state.

In this way, in the case of detecting the mounting positional deviation, it is desirable that the inspection pad portion at each corner is configured by a pad arranged along the direction of the X axis and a pad along the Y axis. This enables the positional deviation in either of the direction of X axis or the Y axis to be detected with a high degree of accuracy.

In addition, in order to further improve the degree of accuracy in the positional deviation, the inspection pads of the IC are continuously formed with the same pitch as that of the signal electrode pad of the IC. The IC inspection pads are connected through a pattern that is located in the area outside of the IC bump or a pattern that is located within the circuit, in accordance with the number of aluminum layers. On the other hand, the inspection patterns are connected to the surface of the substrate through a wiring pattern formed on the substrate, which is made open between the inspection patterns in one location. Then, by using the inspection lands located near opposite ends of the inspection lands, inspection is carried out. Even a product that was defined as no-good by electrical inspection using the above inspection land may be good in an external view inspection and a conduction inspection depending on the measure of accuracy of a bump and pattern accuracy.

In addition, without arranging the inspection land at the corner of the IC, it is possible to derive the inspection land through a pad, which is electrically independent and is located in the vicinity of the area where the inspection land is desirably placed, or a pad, which counts for nothing in the conduction inspection operation. This enables the inspection land to be located at an arbitrary position in accordance with the design of the circuit of the substrate, so that it is possible to make the density of the mounting of the substrate higher.

A display unit according to an embodiment of the present invention will be described with reference to the drawings below.

(A First Embodiment)

Figure 1:
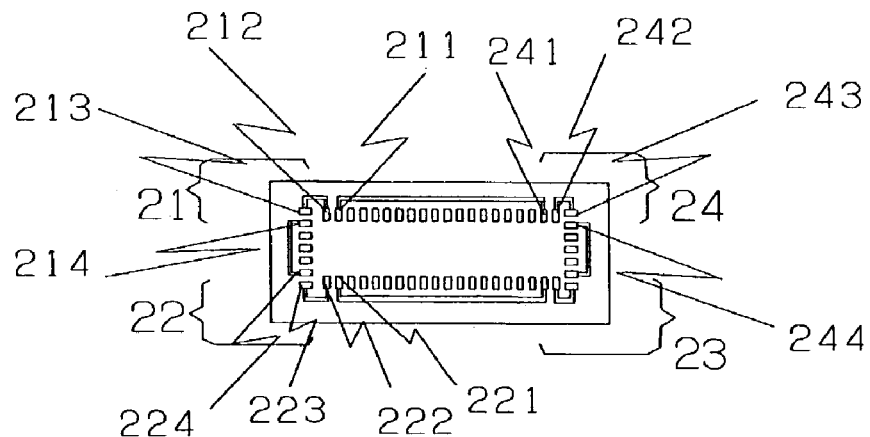
FIG. 1 is a top view of a circuit surface of an IC according to a first embodiment of the present invention.
Figure 2:
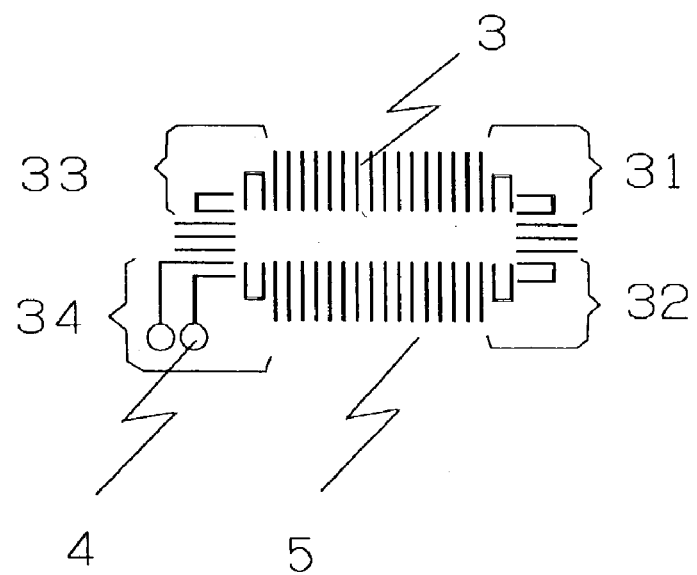
FIG. 2 is a top view of a flexible substrate according to the first embodiment of the present invention.
Figure 3:
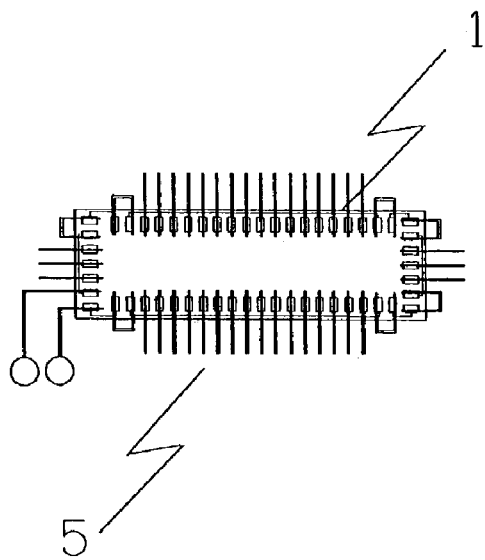
FIG. 3 is a perspective view for showing a configuration of an inspection circuit according to the first embodiment of the present invention.

FIG. 1 is a top view of a circuit surface of an IC1. On the IC1, a plurality of pads 2 (FIG. 5) are 2 is formed about the outer periphery thereof. On each the pad 2, a bump made of gold is placed. At each corner of the IC, inspection pad portions 21, 22, 23, and 24 are formed. Each inspection pad portion is configured by two pads along the X-axis and two pads along the Y-axis, namely, a total of four inspection pads. As shown in the drawing, according to the present embodiment, a pad 212 and a pad 213, which are arranged at the end portions along the X-axis and the Y-axis in the inspection pad portion 21, are electrically connected through an aluminum electrode. In addition, a pad 211 configuring the inspection pad portion 21 is connected to a pad 241 configuring the adjacent inspection pad portion 24 through a wire provided on the outer periphery of the IC1. Basically the same applies to the other inspection bump portions 22, 23, and 24. FIG. 2 is a top view of a pattern 3, which is the IC connection portion of a flexible substrate 5. In the flexible substrate 5, on a polyimide film of 25 µm, a seed layer is deposited in order to improve the adhesiveness, Cu is deposited by 2000 Å, a base material to which an electrolytic Cu plating of about 8 µm is patterned, and a pure Sn layer of 0.2 µm is formed by an electroless Sn plating. Inspection patterns 31, 32, 33, and 34 are disposed, respectively, so as to be opposed to each inspection pad of the IC1. Each inspection pattern is provided with four pads. As shown in the drawing, two pads arranged on the X-axis side are electrically connected, and two pads arranged on the Y-axis side are electrically connected. According to the present embodiment, two pads on the Y-axis side configuring the inspection pattern 34 are not electrically connected but they are used as an inspection land 4. The IC1 and the flexible substrate 5, which are configured in this way, are connected to each other through the Au—Sn eutectic bonding. The wiring after connection is shown by a pattern diagram when the IC is seen through in FIG. 3. As apparent from the drawing, the inspection lands are electrically connected with each other only by mounting the IC1 on the flexible substrate 5. Then, when the electrical characteristics between two inspection lands 4 is open the product can be judged to be no-good, and when the electrical characteristics between two inspection lands 4 is conductive, the product can be judged to be good. In this way, the inspection circuit is configured by wiring between the inspection pad disposed on the IC and the pad formed by necessity, and the wiring between the inspection pattern applied to the substrate and the pad formed by necessity.

Figure 4:
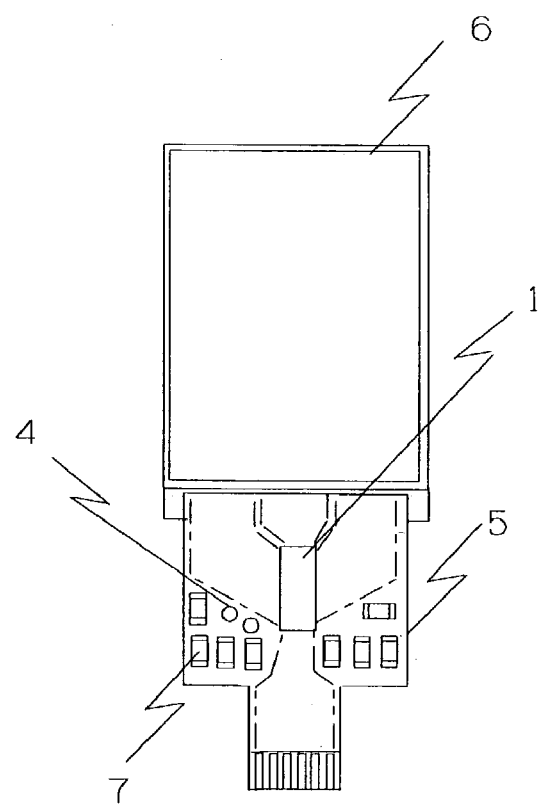
FIG. 4 is a top view of a display unit according to the first embodiment of the present invention.
Figure 11:
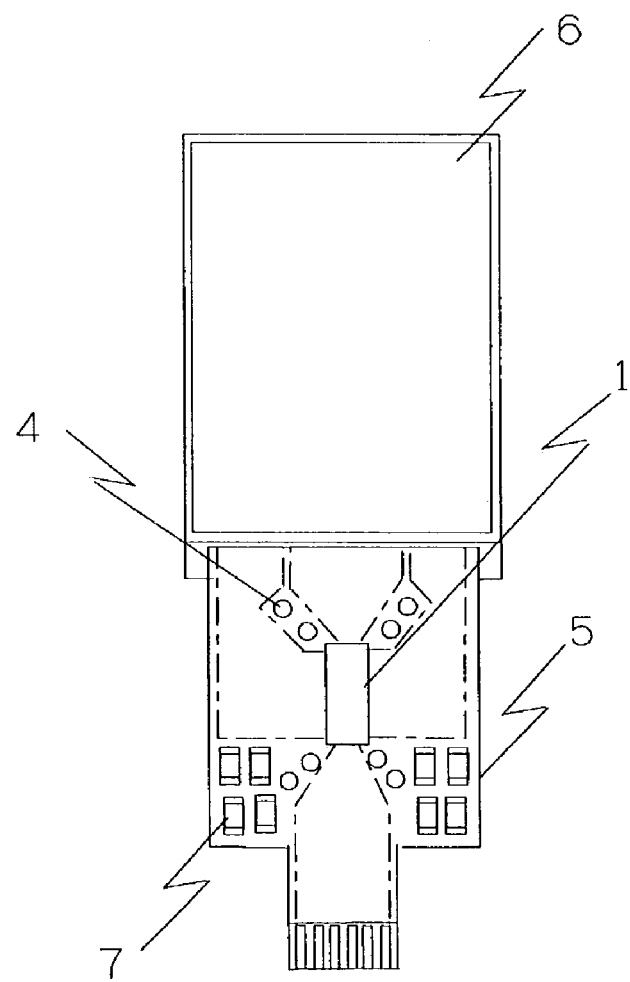
FIG. 11 is a schematic view for showing a conventional display unit.

In the case that the product is judged to be good, the underfill is injected to harden the semiconductor IC. Further, the parts such as a capacitor or the like are connected to the substrate by soldering and the substrate is connected to the display panel by means of an anisotropic conductive film. A molding appearance of the display module that is produced in this way is shown in FIG. 4. As shown in the drawing, the flexible substrate 5, on which the IC1 and a part 7 are mounted, is connected to the display panel 6. In addition, the device is further downsized as a result of reduction of the number of inspection lands 4 from eight places to two places compared with the conventional configuration as shown in FIG. 11.

The inspection circuits are not necessarily placed at four corners but they may be placed at two places in the case of a slim-type IC. In addition, the inspection circuits may be placed at four and more places. The wiring to connect the inspection circuits with each other is not necessarily disposed to either of the IC or the flexible substrate. The inspection circuits may be connected by wirings formed at the both of the IC and the flexible substrate.

(A Second Embodiment)

Figure 5:
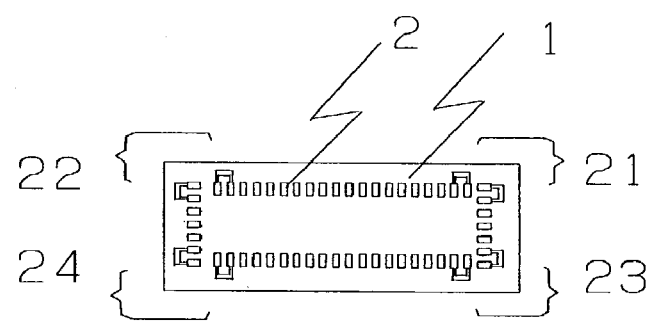
FIG. 5 is a top view of an IC circuit surface according to a second embodiment of the present invention.
Figure 6:
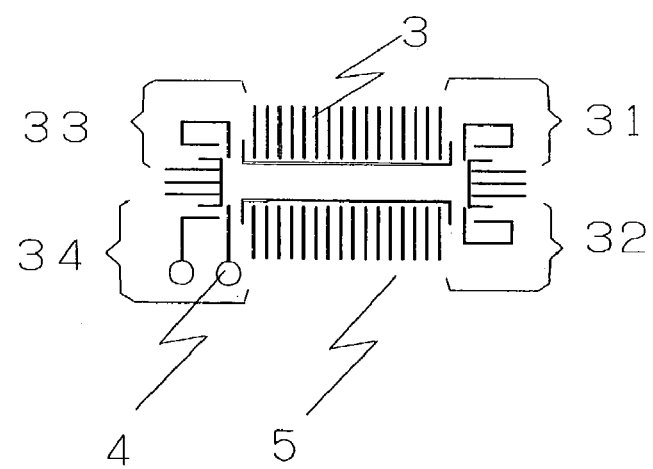
FIG. 6 is a top view of a flexible substrate according to the second embodiment of the present invention.

FIG. 5 is a top view of a circuit surface of the IC1. FIG. 6 is a top view of the pattern 3 of the IC connection portion on the flexible substrate 5. In the present embodiment, the inspection pattern of the flexible substrate 5 and the wiring of the inspection pad of the IC1 are configured contrary to the first embodiment. However, the IC1 is the same as and has the same pads as in FIG. 1. Thus, a description of the pads and the reference numerals thereof will be omitted.

Figure 7:
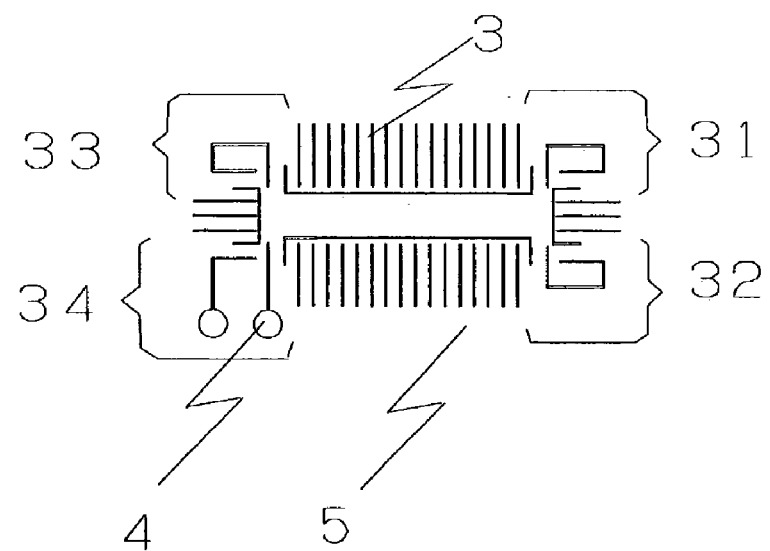
FIG. 7 is a perspective view for showing a configuration of an inspection circuit according to the second embodiment of the present invention.

As shown in FIG. 5, two pads 211 and 212, which are arranged on the X axis side in the inspection pad portion 21 of the IC1, are electrically connected through the aluminum electrode, and two pads 213 and 214, which are arranged on the Y axis side in the inspection pad portion 21 of the IC1, are electrically connected through the aluminum electrode. On the other hand, the inspection patterns 31, 32, 33, and 34 are disposed, respectively, so as to be opposed to each inspection pad of the IC1. Each inspection pattern is provided with four pads in the same way as the inspection pad. As shown in the drawing, the pads 322 and 323 arranged at the end portions on the X axis side and on the Y axis side are electrically connected, and the pad 321 configuring the inspection pattern 32 is electrically connected to the pad 331 of the adjacent inspection pattern 33. According to the present embodiment, two pads 312 and 313 configuring the inspection pattern 31 are not electrically connected but they are used as an inspection 1 and 4. The position where the inspection 1 and is derived is not limited to this position. The ICI and the flexible substrate 5, which are configured in this way, are connected to each other through the Au—Sn eutectic bonding. The wiring after connection is shown by a pattern diagram when the IC is seen through in FIG. 7. As being apparent from the drawing, the inspection lands are electrically connected with each other only by mounting the IC1 on the flexible substrate 5. Then, when the electrical property between two inspection lands 4 is open, the product can be judged to be no-good and when the electrical property between two inspection lands 4 is conductive, the product can be judged to be good.

Further, since the positional deviation is inspected with the mounting margin included, the inspection patterns 31, 32, 33, and 34 of the flexible substrate 5 are arranged in advance so that they do not overlap the inspection pads of the IC. It is judged whether or not the product judged to be no-good is substantially no-good depending on its molding appearance.

(A Third Embodiment)

Figure 8:
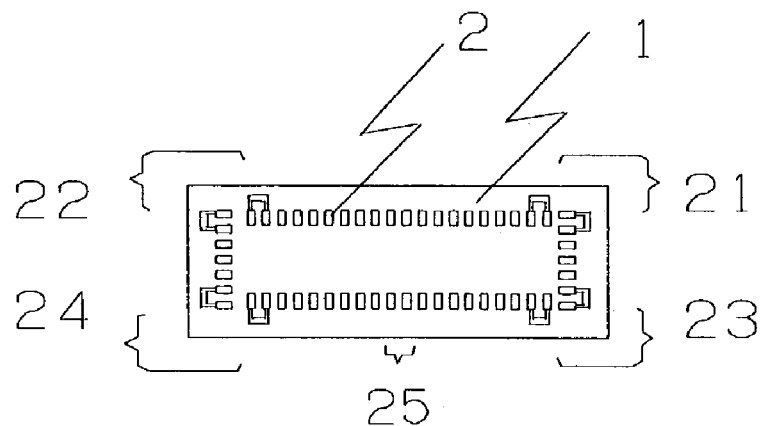
FIG. 8 is a top view of an IC circuit surface according to a third embodiment of the present invention.
Figure 9:
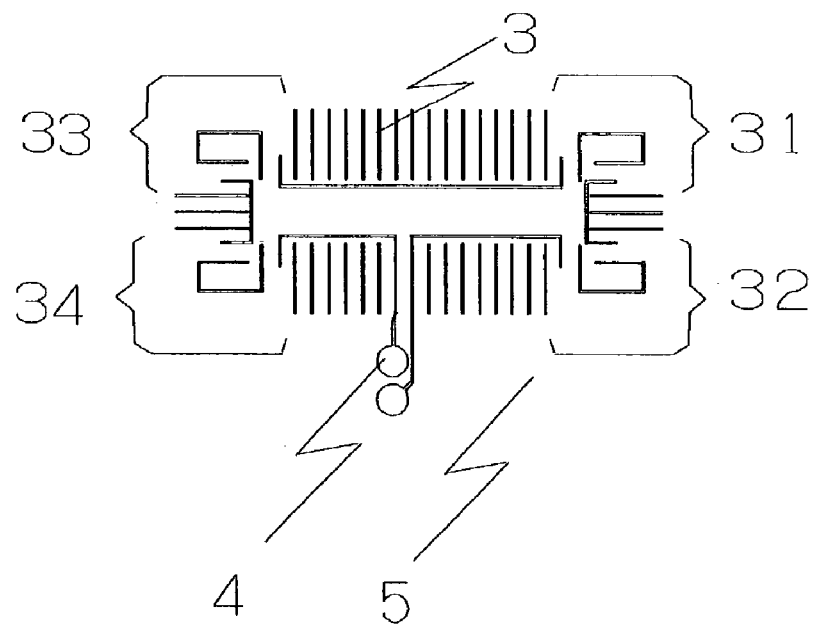
FIG. 9 is a top view of a flexible substrate according to the third embodiment of the present invention.
Figure 10:
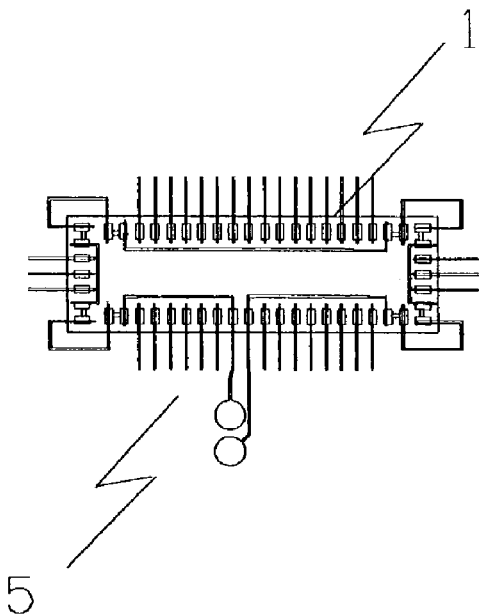
FIG. 10 is a perspective view for showing a configuration of an inspection circuit according to the third embodiment of the present invention.

FIG. 8 is a top view of a circuit surface of the IC1. FIG. 9 is a top view of the pattern 3 of the IC connection portion on the flexible substrate 5. According to the present embodiment, a dummy pad 25 is provided at the position except for the corner portion of the IC, and by using this dummy pad, the inspection land is derived on the flexible substrate 5. Here, the same description as the first embodiment will be appropriately omitted. As shown in the drawing, on the flexible substrate 5, the inspection patterns 31, 32, 33, and 34 are disposed, respectively, so as to be opposed to each inspection pad of the IC1. The inspection land 4 is derived through the position connecting the dummy pad 25 of the IC1. The position where the inspection land is derived is not restricted to this position. The ICI and the flexible substrate 5, which are configured in this way, are connected to each other through Au—Sn eutectic bonding. The wiring after connection is shown by the pattern diagram when the IC is seen through in FIG. 10. When the electrical property between two inspection lands 4 is open, the product can be judged to be no-good and when the electrical property between two inspection lands 4 is conductive, the product can be judged to be good. Since the positional deviation is inspected with the mounting margin included, the inspection patterns 31, 32, 33, and 34 of the flexible substrate 5 are arranged in advance, so that they do not overlap the inspection pads of the IC1. It is judged whether or not the product judged to be no-good is substantially no-good depending on its molding appearance.

Such a configuration facilitates the position where the inspection land 4 is derived, so that the device is capable of being more downsized.

According to each of the above described embodiments, the position where the inspection pad of the IC1 and the inspection pattern of the flexible substrate are formed is determined so that the inspection lands are electrically connected with each other in the case that the IC1 is mounted on the flexible substrate 5 with the favorable positioning and the favorable connection condition. On the other hand, the position where the inspection pad of the IC and the inspection pattern of the flexible substrate are formed may be determined so that the inspection lands are electrically connected with each other in the case that the IC is mounted on the flexible substrate 5 with the unfavorable positioning. In this case, it is possible to detect whether or not the positioning is favorable, however, it impossible to detect whether or not the connection condition of the IC and the substrate is favorable by itself.

According to the present invention, the number of the inspection lands is reduced from eight to two compared with the conventional configuration shown in FIG. 11, so that the mounting area is reduced. As a result, the size of the flexible substrate 5 is downsized, the display module is downsized, and a price of the flexible substrate is decreased, so that it is possible to provide a cheep display module.

What is claimed is:

1. An electronic device comprising: IC having an outer peripheral edge portion and an array of pads disposed along the outer peripheral edge portion so as to provide a plurality of sides and corner portions of the array of pads, a preselected number of the pads disposed at each of the corner portions defining inspection pads of the IC; a substrate on which a plurality of inspection patterns are provided at locations corresponding to the inspection pads of the IC such that each inspection pad is brought into contact with a corresponding inspection pattern when the IC is mounted on the substrate to thereby enable electrical inspection of a mounting condition of the IC on the substrate; a pair of inspection lands provided on the substrate and connected to some of the inspection patterns; and a functional element connected to the substrate and activated by the IC; wherein the inspection pads and the inspection patterns are arranged so that the inspection lands are connected electrically when the IC is mounted on the substrate with deviation; wherein each of the corner portions of the array of pads is formed by portions of each of adjacent sides of the array of pads; and wherein the inspection pads comprise two pairs of inspection pads each disposed on one of the adjacent sides of the array of pads.

2. An electronic device according to claim 1; wherein the inspection pads comprise electrodes of the IC.

3. An electronic device according to claim 1; wherein the substrate is a flexible substrate.

4. An electronic device according to claim 1; wherein the inspection pads and the inspection patterns are positioned at corners of the IC.

5. An electronic device according to claim 1; further comprising a plurality of bumps disposed on respective ones of the pads.

6. An electronic device comprising: an IC having an outer peripheral edge portion and an array of pads disposed along the outer peripheral edge portion so as to provide a plurality of sides and corner portions of the array of pads, a preselected number of the pads disposed at each of the corner portions defining inspection pads of the IC; a substrate on which a plurality of inspection patterns are provided at locations corresponding to the inspection pads of the IC such that each inspection pad is brought into contact with a corresponding inspection pattern when the IC is mounted on the substrate to thereby enable electrical inspection of a mounting condition of the IC on the substrate; a pair of inspection lands provided on the substrate and connected to some of the inspection patterns; and a functional element connected to the substrate and activated by the IC; wherein the inspection pads and the inspection patterns are connected by wiring provided on the IC or on the substrate so that the inspection lands are electrically connected to each other when the IC is mounted on the substrate with deviation; wherein each of the corner portions of the array of pads is formed by portions of each of adjacent sides of the array of pads; and wherein the inspection pads comprise two pairs of inspection pads each disposed on one of the adjacent sides of the array of pads.

7. An electronic device according to claim 1; wherein the inspection pads comprises four inspection pads.

8. An electronic device comprising: an IC having an outer peripheral edge portion, an array of pads disposed along the outer peripheral edge portion so as to provide a plurality of sides and corner portions of the array of pads, a preselected number of the pads disposed at each of the corner portions defining inspection pads of the IC; a substrate on which a plurality of inspection patterns are provided at locations corresponding to the inspection pads of the IC such that each inspection pad is brought into contact with a corresponding inspection pattern when the IC is mounted on the substrate to thereby enable electrical inspection of a mounting condition of the IC on the substrate; a pair of inspection lands provided on the substrate and connected to some of the inspection patterns; and a functional element connected to the substrate and activated by the IC; wherein the inspection pads and the inspection patterns are connected by wiring provided on the IC or on the substrate so that the inspection lands are electrically connected to each other when the IC is mounted on the substrate; wherein each of the corner portions of the array of pads is formed by portions of each of adjacent sides of the array of pads; and wherein the inspection pads comprise two pairs of inspection pads each disposed on one of the adjacent sides of the array of pads.

9. An electronic device comprising:
   a substrate having a plurality of inspection patterns and a pair of inspection lands connected to some of the inspection patterns;
   an IC having an outer peripheral edge portion and an array of pads disposed along the outer peripheral edge portion so as to provide a plurality of sides and corner portions of the array of pads, a preselected number of the pads disposed at each of the corner portions defining inspection pads of the IC, the IC being mounted on the substrate so that the inspection pads are connected to the respective inspection patterns of the substrate by face-down bonding to thereby enable electrical inspection of a mounting condition of the IC on the substrate;
   a functional element connected to the substrate and activated by the IC; and
   wherein the inspection pads and the inspection patterns are arranged so that the inspection lands are connected electrically when the IC is mounted on the substrate with deviation;
   wherein each of the corner portions of the array of pads is formed by portions of each of adjacent sides of the array of pads; and
   wherein the inspection pads comprise two pairs of inspection pads each disposed on one of the adjacent sides of the array of pads.

10. The electronic device according to claim 9; wherein the inspection pads comprise electrodes of the IC.

11. The electronic device according to claim 9; wherein the substrate is a flexible substrate.

12. The electronic device according to claim 9; wherein the inspection pads and the inspection patterns are positioned at corners of the IC.

13. The electronic device according to claim 9; further comprising a plurality of bumps disposed on respective ones of the pads.

14. The electronic device according to claim 13; wherein each of the bumps is made of gold.

15. The electronic device according to claim 9; wherein the inspection pads comprises four inspection pads.

* * * * *